United States Patent [19]
Jeuch et al.

[11] Patent Number: 5,391,881
[45] Date of Patent: Feb. 21, 1995

[54] IONIZING RADIATION IMAGING DEVICE

[75] Inventors: Pierre Jeuch, Seyssins; Marc Cuzin, Corenc, both of France

[73] Assignee: Commissariat a l'Energie Atomique, Paris, France

[21] Appl. No.: 79,370

[22] Filed: Jun. 21, 1993

[30] Foreign Application Priority Data

Jun. 30, 1992 [FR] France .................. 92 08029

[51] Int. Cl.$^6$ ................................. G01T 1/24
[52] U.S. Cl. ............. 250/370.09; 250/370.12; 250/370.13
[58] Field of Search ........ 250/370.11, 370.09, 250/368, 332, 370.12, 370.13, 336.1; 257/226, 428; 378/99, 191, 98.8

[56] References Cited

U.S. PATENT DOCUMENTS

| | | | |
|---|---|---|---|
| 4,160,997 | 7/1979 | Schwartz | 378/191 |
| 4,532,424 | 7/1985 | Cheung | 250/332 |
| 4,593,456 | 6/1986 | Cheung | 250/332 |
| 4,740,700 | 4/1988 | Shaham et al. | 250/332 |
| 4,998,688 | 3/1991 | Longerich | 250/332 |
| 5,015,858 | 5/1991 | Augustine et al. | 250/332 |
| 5,276,329 | 1/1994 | Hughes | 250/370.09 |

FOREIGN PATENT DOCUMENTS

| | | |
|---|---|---|
| 0245147 | 11/1987 | European Pat. Off. . |
| 0415541 | 3/1991 | European Pat. Off. . |
| 0421869 | 4/1991 | European Pat. Off. . |
| 0462345 | 12/1991 | European Pat. Off. . |
| 0485115 | 5/1992 | European Pat. Off. . |

OTHER PUBLICATIONS

Patent Abstracts of Japan, vol. 6, No. 147, (E-123)(1025), Aug. 6, 1982, JP-A-57 71 174, May 1, 1982.

Nuclear Instruments & Methods in Physics Research, vol. A275, No. 3, Mar. 1, 1989, pp. 580-586, S. L. Shapiro, et al., "Silicon Pin Diode Array Hybrids For Charged Particle Detection".

IEEE Nuclear Science Symposium, Nov. 7, 1989, pp. 1-8, M. Campbell, et al., "A 10 MHz Micropower CMOS Front-End For Direct Readout Of Pixel Detectors".

*Primary Examiner*—Constantine Hannaher
*Assistant Examiner*—Edward J. Glick
*Attorney, Agent, or Firm*—Oblon, Spivak, McClelland, Maier & Neustadt

[57] ABSTRACT

The device has at least one planar detector ($2_a$, $2_b$) able to transform a radiation (8) into electrical charges and a common electrode (12) on an input face and a mosaic of point electrodes (14) and metal bands ($34_a$–$34_e$) on an output face, several planar integrated circuit chips ($10a$, $10b$) facing the input face of the detector and having a mosaic of reading circuits (16) and metal bands ($30a$, $30d$) for connecting the circuits to external supply, control and processing devices for output signals, each reading circuit being hybridized by a microsphere to a point electrode and the bands of the chip being positioned facing bands of the detector and hybridized thereto by microspheres. The device is to be used in mamography or dental imaging.

12 Claims, 5 Drawing Sheets

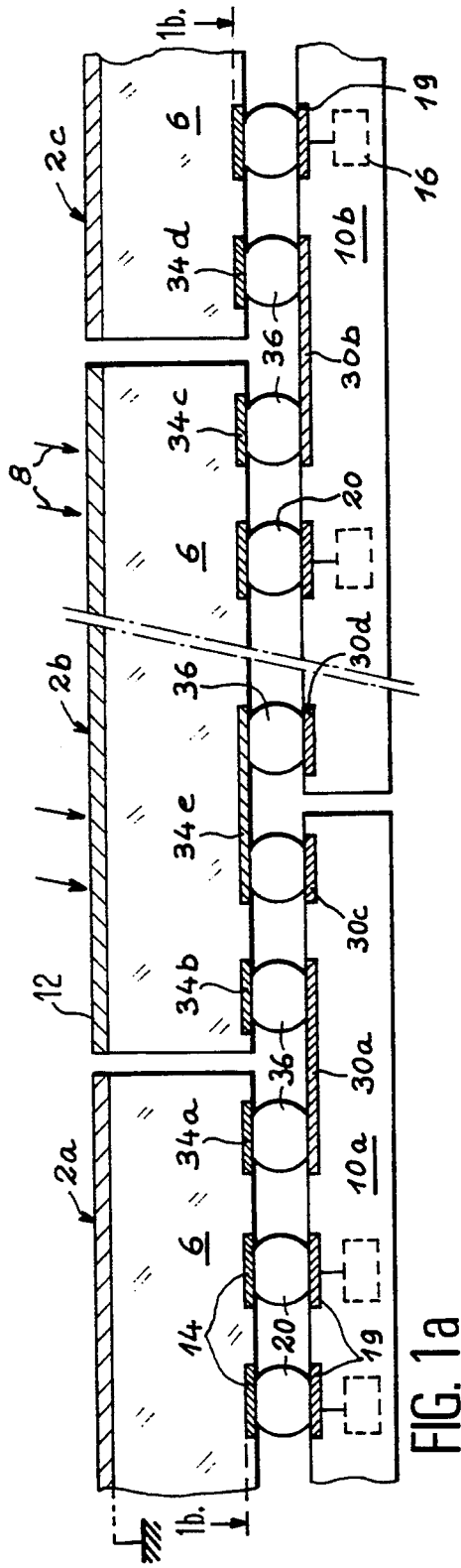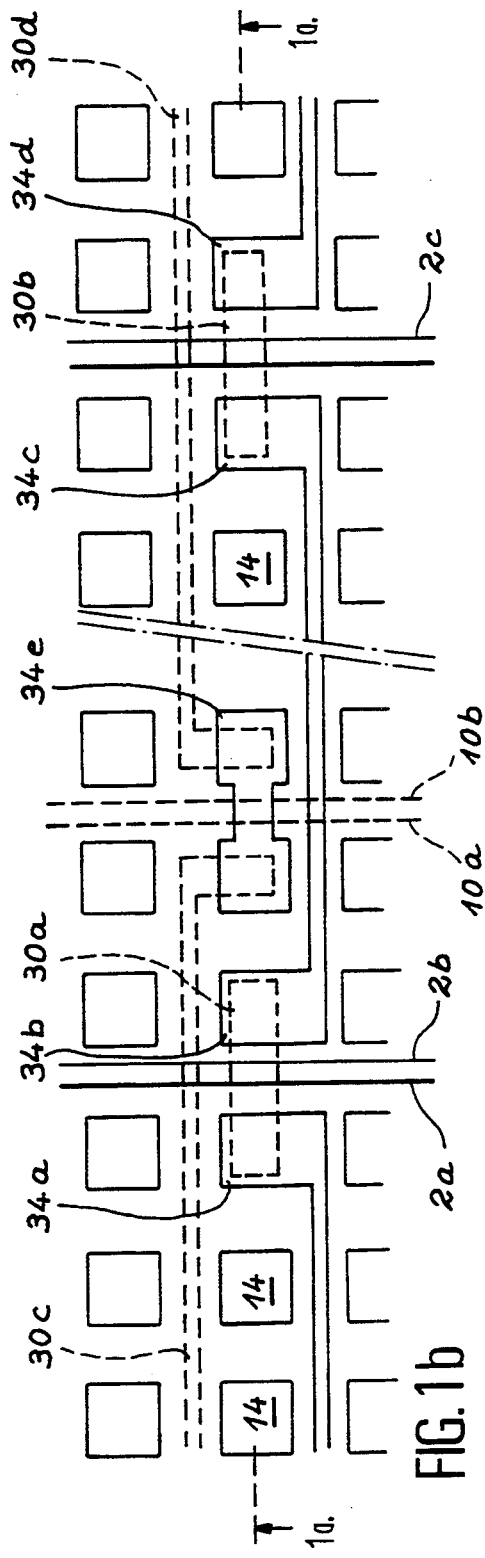

IONIZING RADIATION IMAGING DEVICE

BACKGROUND OF THE INVENTION

1. Field of the Invention

The present invention relates to an imaging device, either for ionizing radiation such as X or gamma rays or charged particles, or for light radiation, whose wavelength can be in the visible, ultraviolet or infrared. More specifically, the invention applies to non-focusable ionizing radiation.

2. Description of the Prior Art

The imaging or taking of images of an ionizing radiation makes it possible by radiographic projection or tomographic reconstitution to study living or non-living matter and consequently carry out a non-destructive analysis of the internal structure of objects having variable sizes and masses and in particular in medical and nuclear fields, but also in industry. This device can be of a large size, namely having a surface area of a few dozen to a few hundred $cm^2$, mainly for mamography, or of a small size, namely a few hundred $mm^2$, e.g. for intrabuccal dental imaging. In the latter case, the device can have a total thickness of 3 mm. This compactness is very important so as not to be prejudicial either to the patient or to the dentist.

An imaging device has in known manner a radiation detecting part constituted by one or more detectors transforming the incident radiation into electrical charges and having electrodes for collecting these charges and a part for treating the electric signals resulting from the collection of the charges and constituted by integrated circuits for amplifying said electric signals and an external device for the processing and storage of the signals supplied by said integrated circuits. In addition, each detector is structured in the form of elementary display points or pixels arranged in accordance with the rows and columns of a matrix.

In a first type of detector use is made of a semiconductor material equipped with point electrodes distributed in matrix form. In this type of detector, the electrical connection of the reading circuits to each detector is provided in known manner by pixelwise microsphere hybridization.

Such a system is described by M. Campbell et al (A 10 MHz micro power CMOS front-end for direct readout of pixel detectors, IEEE Nuclear Science Symposium USA, 1989, pp 1–8) and in EP-A-415 541 and EP-A-462 345.

In another detector type use is made of charge coupled devices (CCD) which are directly irradiated. The irradiation of these CCD's leads to a premature ageing, which brings about a sensitivity loss and defective pixels.

In dental radiography, the X-rays used have a high energy of 30 to 60 keV. In addition, the imaging device as a limited thickness of generally 300 to 500 $\mu m$, so that it only has an X-ray stopping power of a few per cent (<10%). Therefore 90% of the X-photons (and therefore the dose) are needlessly imposed on the patient, which is a major disadvantage.

For mamography use is made of X-rays with an energy of 15 to 25 keV.

For producing large imaging devices, it is known to use several matrixes or arrays of detectors joined side by side as described in EP-A-245 147 or arranged in the manner of the tiles of a roof as described in EP-A- 421 869.

In EP-A-245 147, the detector is a thick scintillator transforming the ionizing rays into visible light and associated with a photodiode structured as pixels. These imaging devices generally lead to images having shadow areas and information losses.

SUMMARY OF THE INVENTION

The invention relates to a novel imaging device using hybridization by microspheres of reading circuits in pixelwise manner which makes it possible to obviate the abovementioned disadvantages.

The invention more specifically relates to a radiation imaging device having at least one planar detector able to transform the radiation into electrical charges and having a common electrode on an input face serving to receive the radiation, a mosaic of point electrodes and metal bands on an output face opposite to the input face, planar integrated circuit chips positioned facing the output face of the detector and incorporating a mosaic of reading circuits, an addressing circuit connected to the reading circuits and metal bands for connecting the reading and addressing circuits to external supply, control and processing circuits for the output signals, each reading circuit being hybridized by a microsphere to a point electrode, the metal bands of the integrated circuit chip being positioned facing the metal bands of the detector and hybridized thereto by microspheres.

Preferably, the detector is formed by a solid semiconductor material coated on one of its faces with the common electrode and on the opposite face with the point electrodes. This semiconductor material can be of any known type such as germanium, silicon, binary, ternary or quaternary alloys of III and V elements or II and VI elements of the periodic classification of elements.

In order to obtain a high detector X-ray stopping power and therefore reduce the irradiation dose in the medical field, use is made of a semiconductor material having a high average atomic number exceeding 30. The average atomic number is defined as the sum of the atomic numbers of simple bodies constituting the detector divided by the number of atoms of material and e.g. for CdTe, average=50. This, for a 80 $\mu m$ CdTe detector, 99% of a 40 keV X-radiation are stopped and the dose imposed on the patient can be reduced by a factor of 10.

In addition, the forbidden energy band must be as high as possible and exceed 1.30 eV.

This semiconductor is in particular silicon, GaAs or preferably CdTe or $HgI_2$ with a high electrical resistivity (e.g. $10^9$ ohms.cm for CdTe).

The use of a solid, homogeneous, high resistivity semiconductor makes it possible to limit the leakage current between the common electrode and the point electrodes. Moreover, the use of a semiconductor improves the spatial quality of the image and its contrast as compared with the use of a scintillator, because a photon creates charges in a small semiconductor volume (a few $\mu m^3$ for a 40 keV X-photon), whereas the information can be laterally diffused in the scintillator. This makes it possible to produce a very thick detector (500 to 1000 $\mu m$), thereby improving its radiation stopping power.

In addition, the efficiency of a semiconductor is greater than that of a scintillator and can be up to 50%, whilst its sensitivity is also improved. Thus, microcalcifications below 100 um can be detected in a breast.

It is still possible to use a PN junction or a Schottky rectifying contact. The detector can be a scintillator converting the ionizing radiation into visible light, covering a photodiode structured in display pixels and ensuring the transformation of the light into an electrical signal.

For producing a large imaging device, use is made of several detectors joined side by side and arranged in the form of a matrix, said detectors being interconnected and associated with several integrated circuit chips joined side by side, interconnected and also arranged in matrix form.

The integrated circuit chips have the same dimensions as the detectors or dimensions equal to an integral multiple or submultiple of the dimensions of said detectors.

Advantageously, the integrated circuit chips are displaced with respect to the detectors in one or two perpendicular directions contained in a plane parallel to that of the detectors, so as to partially face two or four adjacent detectors.

Advantageously, the electrical connection between two consecutive detectors is ensured by a metal band or strip formed on the chip of the integrated circuits partly facing said two consecutive detectors and by microspheres.

Advantageously, the electrical connection between two consecutive chips is ensured by a metal band formed on the detector partly facing the two consecutive chips and by microspheres.

In a variant, the inter-detector and inter-integrated circuit electrical connections can be respectively displaced between individual columns or rows. This permits a lateral connection of the device according to the invention to the external supply, control and processing circuits for the signals.

In the case of n chips arranged along the same row of the matrix of chips and n specific metal bands 1 to n for carrying to the processing circuit the specific output signals of said n chips, said bands having an input and an output, the output end of the ith band is connected to the input end of the (i+1)th band with $1 \leq i \leq n$, i and n being integers with $n \geq 2$, the first band of a given chip supplying the specific output signal of said given chip.

BRIEF DESCRIPTION OF THE DRAWINGS

The invention is described in greater detail hereinafter relative to non-limitative embodiments and with reference to the attached drawings, which show:

FIGS. 1a & 1b Diagrammatically, in longitudinal section and in plan view along the plane B—B of FIG. 1a, an imaging device according to the invention.

DESCRIPTION OF THE PREFERRED EMBODIMENTS

Figure 1C:
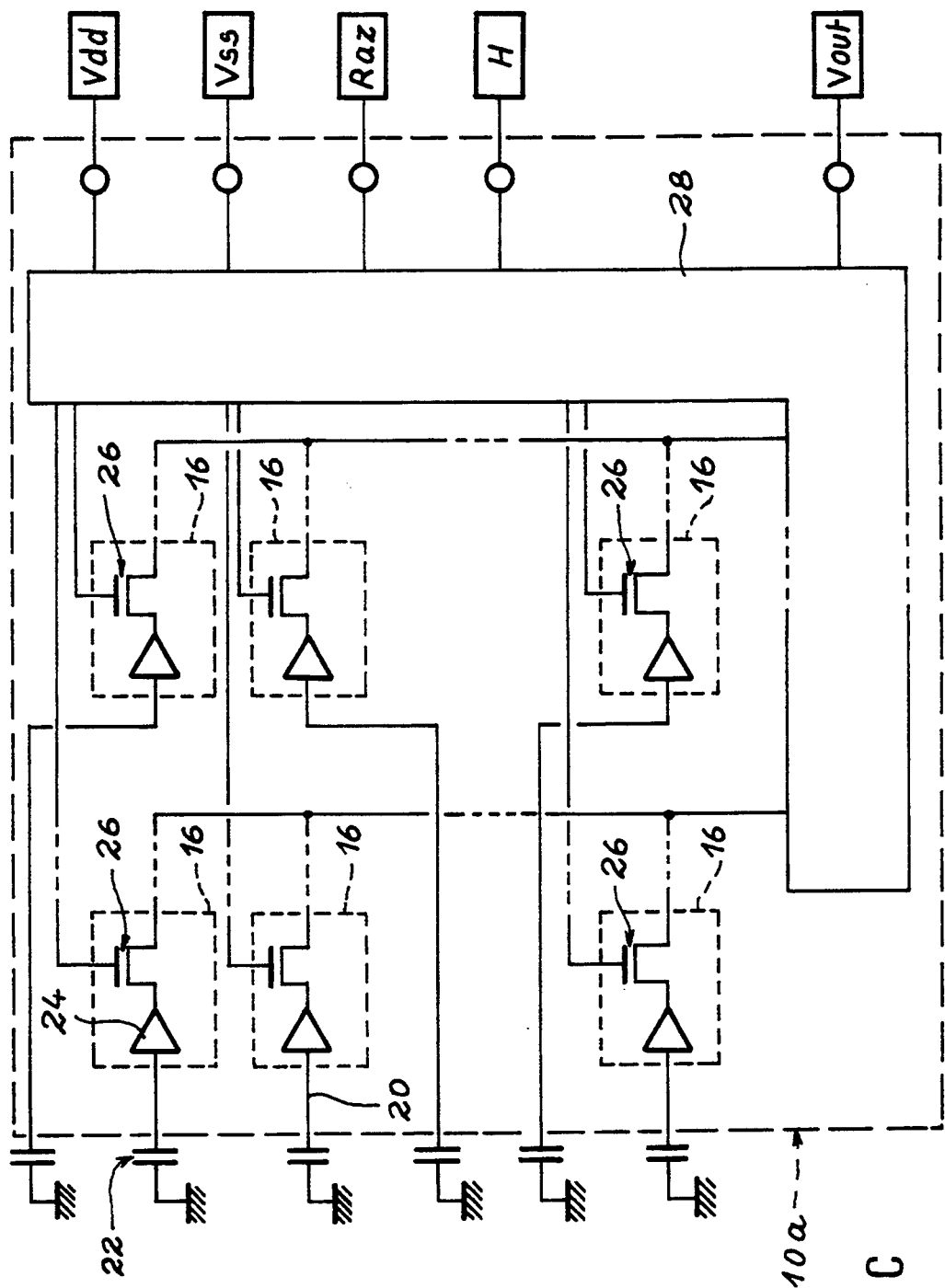
FIG. 1c The equivalent circuit diagram of a detector-chip array of the device according to the invention.

The imaging device according to the invention and shown in FIGS. 1a and 1b has several planar detectors 2a, 2b, 2c, 2d, 2e, 2f arranged side by side, so as to form a matrix of detectors having rows and columns.

Each of these detectors has a high resistivity, homogeneous, solid semiconductor material 6, e.g. silicon, GaAs, CdTe or $HgI_2$ with an input face for receiving ionizing radiation 8 and an output face opposite to the input face and facing integrated circuit chips 10a, 10b, 10c, 10d on silicon. The radiation 8 e.g. comes from an irradiated object to be analyzed.

The input face of each detector 2a-2f has a common electrode 12 completely covering it when the output face supports point electrodes 14 arranged in mosaic-like manner. Thus, each detector 2a-2f is structured by its output face in the form of elementary image points or pixels. The common electrodes 12 and point electrodes 14 are made from metal, such as aluminium and have a thickness of 1 μm. When a semiconductor detector receives ionizing radiation 8, it produces electron-hole pairs in the semiconductor 6 and they are collected by the electrodes 12 and 14.

The thickness of the semiconductor 6 is dependent on the material used, the energy of the radiation to be detected and the envisaged application. For example, use is made of a thickness of 500 μm for detecting X-rays of a few dozen keV with CdTe. In the seine way, the surface dimensions of the point electrodes and therefore the pixels are dependent on the envisaged application.

Typically in radiography, tomography or mamography, these point electrodes are $100 \times 100$ μm² or $80 \times 80$ μm² and are separated by a distance of 20 μm.

Each of the integrated circuit chips 10a-10d has a mosaic of reading circuits 16 forming rows and columns.

The number of integrated circuit chips is equal to the number of detectors and said number is dependent on the planned application. Moreover, the dimensions of the chips and the detectors in the x-y plane parallel to the output faces of the detectors are identical.

In particular, each detector and each chip has in the xy plane a surface of $1.5 \times 1.5$ cm². The dimensions of the point electrodes 14 in the x-y plane are identical to those of the reading circuits 16. The connection between each point electrode 14 and between the contact elements 19 of each reading circuit 16 is ensured by an indium sphere or bell 20.

FIG. 1c is the equivalent circuit diagram of a detector-chip array according to the invention more particularly showing the external supply, control and output connections.

Each detector pixel is represented by a capacitor 22, whose armatures are the electrodes 12 and 14, the electrode 12 being raised to earth potential. The capacitor 22 is connected via an indium ball 20 to an amplifier 24 and then to a switch 26 of the pixel reading MOS transistor type.

These switches 26 are activated successively via the addressing rows and columns using the sequential addressing circuit 28 known as a scanning circuit. Thus, the circuit 28 addresses each detection pixel in succession, producing their address from an external clock H.

The addressing circuit 28 is also connected to an external electric power source supplying a supply voltage Vdd with respect to earth or fixed reference voltage Vss. Moreover, the circuit 28 is connected to an external reading initialization circuit supplying a signal $R_{az}$.

Each transistor 26 supplies, following its addressing, a specific output signal $V_{out}$ of the ionizing radiation 8 which has struck the corresponding pixel. The video signal produced (or succession of signals $V_{out}$) is processed in an external information processing and storage device of the microprocessor type.

The invention does not relate to the functionality or arrangement of the different components 24, 26, 28 in each chip, but to the connection of said chips to the supply Vdd, clock H, reading initialization $R_{az}$ signals, as well as the connection to ground of said chips, via the detectors serving as connection supports.

The invention also relates to the manner of connecting each specific output $V_{out}$ of each chip to the external processing or storage circuit.

Figure 2:
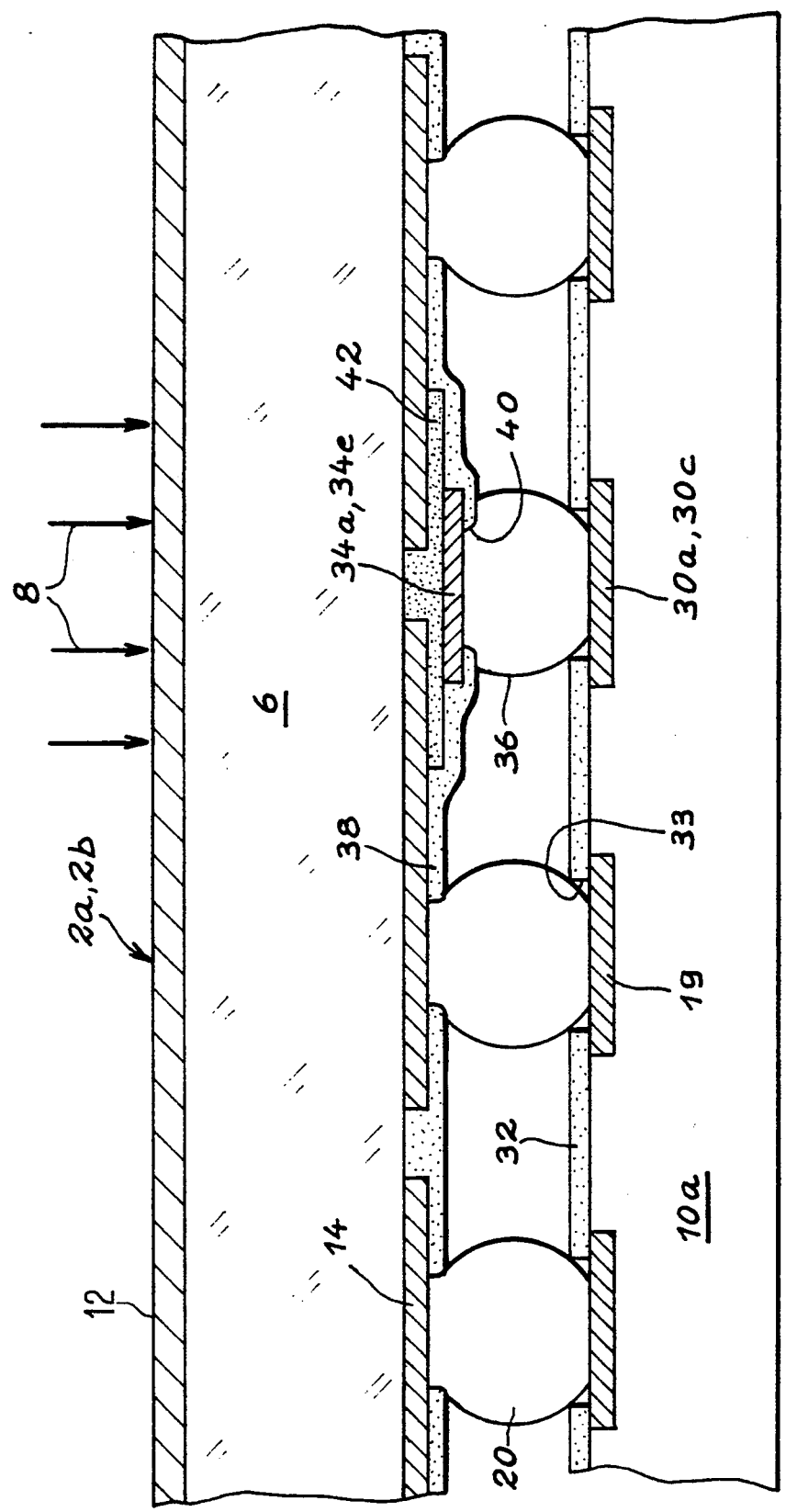
FIG. 2 On a larger scale and in a first variant the connections between a detector and the associated integrated circuit chip according to the invention.

For connecting each chip 10a-10d to the exterior, respectively to the electric power source, to ground, to the initialization circuit, to the clock and to the processing device, the invention proposes supplementary metal bands or strips 30a, 30b, 30c, 30d on the surface of each chip, as shown in FIGS. 1a, 1b and 2. In FIG. 2 the reference 32 represents the final silica passivating layer of the chip having, compared with the prior art, openings 33 facing supplementary metallizations 30a-30d of the chips.

In the same way, the output faces of each detector 2a-2f have supplementary metal bands 34a, 34b, 34c, 34d, 34e facing the metal bands 30a-30d of the chips. As for the metallizations 30a-30d of the chips, the metallizations 34a-34e of the detectors are covered with a silica passivating layer 38 having openings 40 facing the metallizations 34a-34e. The metallizations 30a-30d and 34a-34e are e.g. made from 1 μm thick aluminium.

According to the invention, the connection of these bands 30a-30d to the bands 34a-34e is provided by means of indium microspheres 36, like the connection of the point electrodes 14 to the contact elements 19 of the transistors 24 of the reading circuits.

According to a first variant shown in FIG. 2, the metallizations 34a-34e formed on each detector are electrically insulated from the point electrodes 14 by insulating strips 42 having surface dimensions greater than those of the metallizations 34a-34e. These insulating strips 42 are in particular made from 5 μm thick polyimide.

Figure 3:
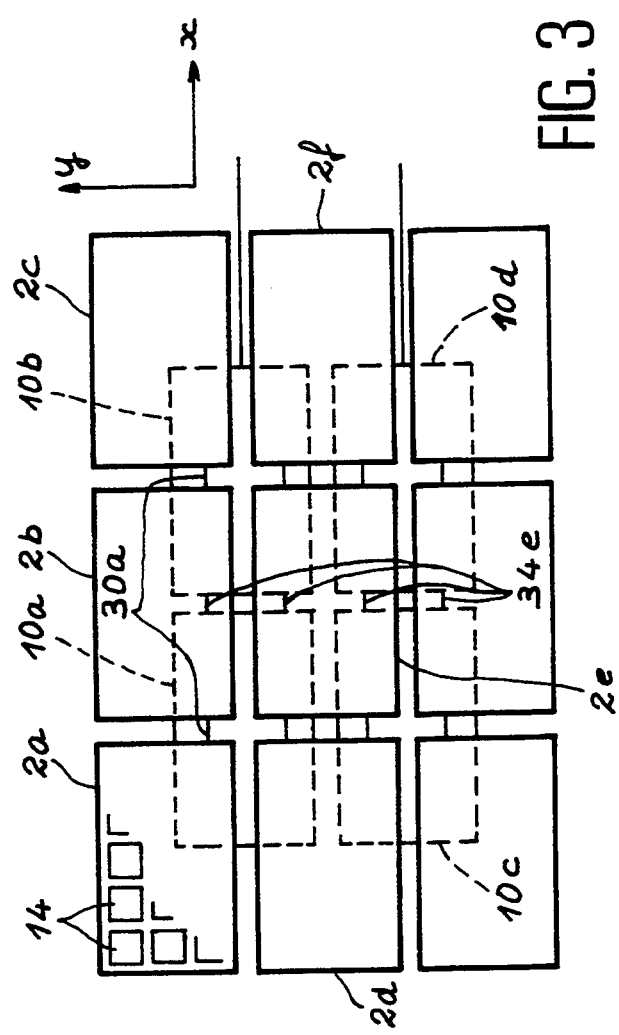
FIG. 3 A variant of the device according to the invention.

As shown in FIGS. 1a and 1b and in accordance with the invention, the chips 10a-10d are displaced relative to the detectors by approximately one spacing in accordance with a direction e.g. x or, as shown in FIG. 3, in accordance with two directions (x-y). Thus, each chip partly faces two or four detectors, e.g. the chip 10a facing the detectors 2a, 2b (FIGS. 1a-2b) and possibly also the detectors 2d, 2e.

According to the invention, the detectors 2a-2f are electrically interconnected by electrical connections connected to the metallizations 34a-34d and the chips 10a-10d are electrically interconnected by electrical connections connected to the metallizations 30c, 30d in such a way that the input signals (Vdd, Vss, $R_{az}$, H) are laterally applied to the imaging device and the output signals $V_{out}$ are also recovered on one of the sides of the imaging device.

According to the invention, the electrical connections between two consecutive detectors are constituted by metallizations formed on the chip facing the edges of these two detectors to be connected (cf. FIG. 1b) and microspheres 36 connecting the metallizations of said chip to the metallizations of said detectors.

For example, the metallizations 30a of the chip 10a is connected to the peripheral metallizations 34a, 34b respectively of the detectors 2a and 2b, via facing spheres 36, thus ensuring the interconnection of said two detectors. In the same way, the metallization 30b of the chip 10b is connected to the peripheral metallizations 34c and 34d respectively of the detectors 2b and 2c, via the facing spheres 36, thus ensuring the interconnection of these two detectors.

In parallel, the connections between two consecutive chips are obtained with the aid of metallizations formed on the detector facing the edges respectively of the two chips to be connected and microspheres 36 facing these metallizations. For example (FIG. 1b) the metallizations 34e of the detector 2b ensures the connection of the metallizations 30d, respectively of the chips 10a and 10b, via facing indium spheres 36 and therefore the interconnection of the chips 10a and 10b.

Figure 4:
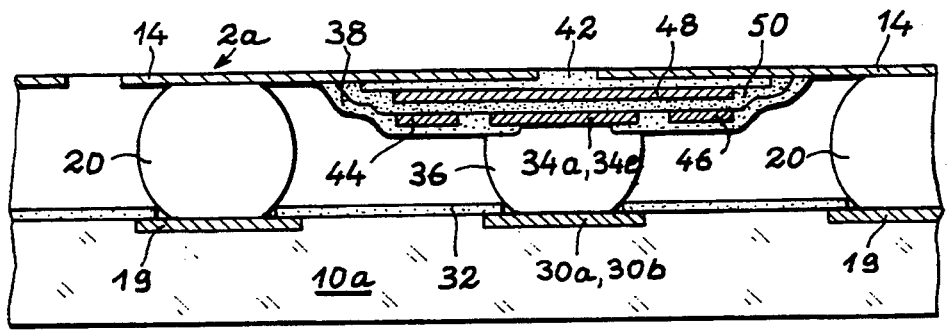
FIGS. 4 & 5 Diagrammatically and in section variants of connections between the detector and the associated integrated circuit chip.

FIG. 4 shows a variant of the metallizations 34a-34e of the output face of the detectors, more particularly making it possible to disengage the point electrodes 14 from said metallizations. For this purpose, on either side of each metallization 34a, 34e use is made of two conductive strips 44, 46 and a metallization 48 interposed between the electrode insulant 42 and the metallizations 34a, 34e, 44 and 46. The metallization band 48 is also insulated from the metallizations 34a, 34e, 44 and 46 by an insulant 50, e.g. of polyimide.

The metallizations 44, 46 are produced at the same time as the metallizations 34a, 34e in the seine aluminium layer. The layer 48 is formed by etching a 1 μm thick aluminium layer and serves as a shield between the point electrodes 14 and the metallizations 34a, 34e. To complete the said lateral shield effect, the metallizations 44, 46 are connected to earth or to a fixed potential.

Figure 5:
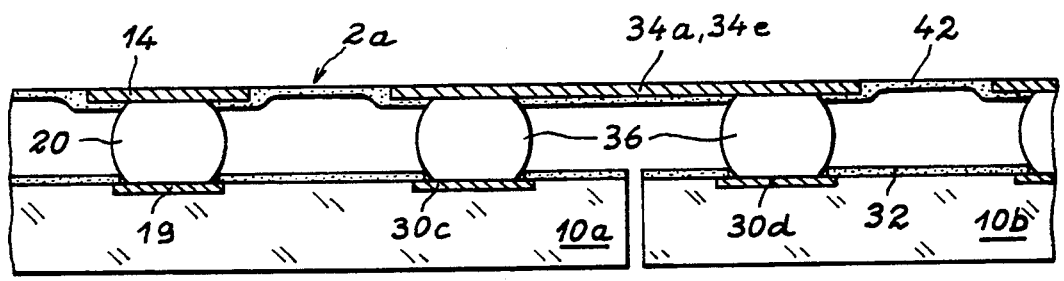

FIG. 5 shows another variant of the metallizations of the output face of the detectors for ensuring the interconnection thereof. In this variant, metallizations such as 34a and 34e are constituted by point electrodes. This solution suffers from the disadvantage of eliminating the point electrodes at the locations intended for the interconnection metallizations of the detectors and the chips. However, on the other hand this solution is much simpler to achieve than that shown in FIGS. 2 and 4.

The supply signals Vdd, earth Vss, reading initialization signals $R_{az}$ and the clock H are supplied simultaneously and in parallel to all the chips 10a-10d. Consequently these signals are applied to connections common to all the chips. However, the output signal $V_{out}$ is specific to each chip 10a-10d.

For radiography purposes, it is necessary to individualize the signals $V_{out}$ supplied by each chip. For this purpose, it is possible to personalize each chip in such a way that the signal $V_{out}$ exits from each chip at a different point. This requires a personalization of each chip at the time of manufacture, which is prejudicial to mass production and makes the imaging device somewhat more complicated.

Figure 6:
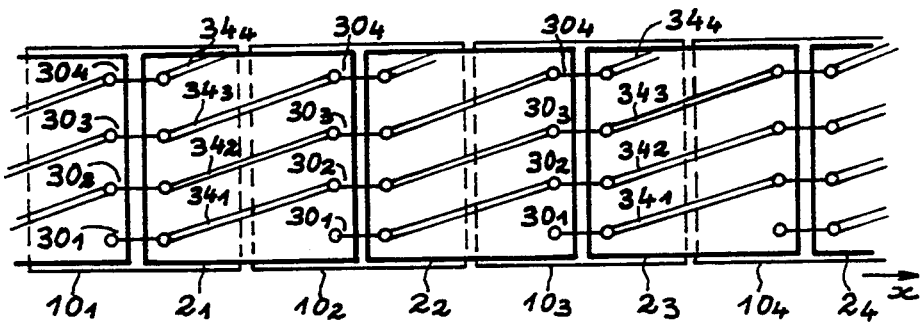
FIG. 6 Diagrammatically an embodiment of the connections respectively between the chips and the detectors according to the invention.

In addition, for the output signals $V_{out}$ of the different device chips to all pass out on the same side of the device in parallel, the invention proposes an original connection of the different outputs, as shown in FIG. 6.

FIG. 6 shows four chips (n=4) $10_1$, $10_2$, $10_3$, $10_4$ of the same row of the chip matrix, displaced in the x direction with respect to the detectors $2_1$, $2_2$, $2_3$, $2_4$ of the same detector matrix row. Each chip $10_i$ (with i between 1 and 4) has four supplementary metallizations $30_1$, $30_2$, $30_3$ and $30_4$ (shown in thin line form). In the same way each detector $2_i$ has supplementary metallizations $34_1$, $34_2$, $34_3$, $34_4$, shown in the form of bands.

According to the invention, the output end of the metallization $30_i$ of each chip $10_i$ is connected to the input end of the metallization $30_{i+1}$ of the following chip $10_{i+1}$, via the metallization $34_i$ formed on the detector $2_i$, respectively facing two successive chips $10_i$ and $10_{i+1}$, the connection being ensured by means of microspheres.

Thus, the output end of the metallization $30_2$ of the chip $10_1$ is e.g. connected to the input end of the metallization $30_3$ of the chip $10_2$ via the metallization $34_2$ formed on the detector $2_1$ facing the chips $10_1$ and $10_2$ and with the aid of microspheres facing said metallizations.

Thus, the output $30_4$ of the chip $10_4$ supplies the signal $V_{out}$ from the chip $10_1$. In the same way, the output of the metallization $30_3$ of the chip $10_4$ produces the signal $V_{out}$ from the chip $10_2$ and the output of the metallization $30_1$ of the chip $10_4$ supplies the signal $V_{out}$ from the chip $10_4$.

This connection method makes it possible to produce identical chips with their contact hole supplying the voltage $V_{out}$ at the same location, thus facilitating their manufacture. This individualization of the output signals is made possible by the use of microspheres, the displacement by one spacing of the detectors with respect to the chips and the respective use of detectors as the metallization support between the chips for their connection, via microspheres, and chips as the metallization support between the detectors for their connection, via microspheres.

Instead of producing the metallizations $30_i$ of the chips in the x direction and the metallizations $34_i$ of the detectors in an oblique manner (FIG. 6), it is possible to produce the metallizations $34_i$ parallel to the x direction and in this case orients in an oblique manner the metallizations $30_i$ of the chips.

In the case of an intra-buccal dental imaging device, the system of detectors and integrated circuit chips can be placed in a tight, electrically insulated box or case having an X-ray-transparent material window.

We claim:

1. A radiation imaging device comprising:
   at least one planar detector comprised of a bulk material which transforms, throughout its volume, ionizing radiation into electric charges;
   a common electrode formed on an input face of said bulk material through which said ionizing radiation enters said radiation imaging device;
   a mosaic of point electrodes and metal bands formed on an output face of said bulk material which is spaced apart from and opposed to said input face;
   a plurality of planar integrated circuit chips spaced apart from and facing said output face of said bulk material, said planar integrated circuit chips comprising a mosaic of reading circuits;
   an addressing circuit, connected to said reading circuits; and
   metal bands for connecting said reading circuits and said addressing circuit to an external power supply circuit, a control circuit, and a processing circuit, wherein each of said reading circuits is hybridized by at least one microsphere to one of said point electrodes, and said metal bands of said planar integrated circuit chips are positioned facing said metal bands of said output face and hybridize thereto by microspheres.

2. A radiation imaging device according to claim 1, further comprising at least two levels of mutually insulated metal bands provided on said output face of said at least one planar detector.

3. A radiation imaging device according to claim 1, wherein said metal bands of said at least one planar detector are electrically insulated from said point electrodes of said at least one planar detector by an electrically insulating layer.

4. A radiation imaging device according to claim 1, wherein the dimensions of said planar integrated circuit chips are the same as those of said at least one planar detector.

5. A radiation imaging device according to claim 1, wherein said at least one planar detector is comprised of a solid semiconductor material one face of which is covered by said common electrode and an opposite face of which is covered by said point electrodes.

6. A radiation imaging device according to claim 5, wherein said semiconductor material has an average atomic number exceeding 30.

7. A radiation imaging device according to claim 5, wherein said semiconductor material is chosen from among silicon, gallium arsenide, cadmium telluride, and mercuric iodide with high resistivity.

8. A radiation imaging device according to claim 1, wherein:
   said at least one planar detector comprises a plurality of planar detectors joined side by side and arranged in the form of rows and columns of a first matrix, said arranged planar detectors being interconnected by electrical connections, and
   said plurality of planar integrated circuit chips are joined side by side and arranged in the form of rows and columns of a second matrix facing said first matrix, said arranged integrated circuit chips being interconnected by electrical connections.

9. A radiation imaging device according to claim 8, wherein n planar integrated circuit chips and n specific metal and for carrying to said processing circuit specific output signals of said n planar integrated circuit chips are arranged along a single row of said second matrix, said n specific metal bands each having an input terminal and an output terminal, the output terminal of the ith band being connected to the input terminal of the (i+1)th band, where $1 \leq i \leq n$, i and n being integers with $n \geq 2$, and a first specific metal band of a given chip supplying a specific output signal of said given chip.

10. A radiation imaging device according to claim 8, wherein said planar integrated circuit chips are disposed so as to partly face at least two consecutively-arranged planar detectors.

11. A radiation imaging device according to claim 10, wherein metal bands of consecutively-arranged planar integrated circuit chips partly face a metal band of one of said at least one planar detector so that electrical connections are assumed therebetween via microspheres disposed between said planar integrated circuit chips and said planar detector.

12. A radiation imaging device according to claim 10, wherein metal bands of consecutively-arranged planar detectors partly face a metal band of one of said planar integrated circuit chips so that electrical connections are assumed therebetween via microspheres disposed between said planar integrated circuit chip and said planar detectors.

* * * * *